(12) United States Patent
Høyerby et al.

(10) Patent No.: US 9,231,583 B2
(45) Date of Patent: Jan. 5, 2016

(54) POWER TRANSISTOR GATE DRIVER

(75) Inventors: Mikkel Høyerby, København (DK); Jørgen Kragh Jakobsen, Virum (DK)

(73) Assignee: MERUS AUDIO APS, Herlev (DK)

( * ) Notice: Subject to any disclaimer, the term of this patent is extended or adjusted under 35 U.S.C. 154(b) by 101 days.

(21) Appl. No.: 14/125,501

(22) PCT Filed: Jun. 13, 2012

(86) PCT No.: PCT/EP2012/061161
§ 371 (c)(1),
(2), (4) Date: Feb. 7, 2014

(87) PCT Pub. No.: WO2012/171938
PCT Pub. Date: Dec. 20, 2012

(65) Prior Publication Data
US 2014/0300413 A1     Oct. 9, 2014

Related U.S. Application Data

(60) Provisional application No. 61/496,663, filed on Jun. 14, 2011.

(51) Int. Cl.
*H03F 3/217* (2006.01)
*H03K 17/687* (2006.01)
*H02M 1/08* (2006.01)
*H03K 17/06* (2006.01)

(52) U.S. Cl.
CPC ............. *H03K 17/687* (2013.01); *H02M 1/08* (2013.01); *H03F 3/2171* (2013.01); *H03F 3/2173* (2013.01); *H03K 17/063* (2013.01); *H03K 17/6871* (2013.01)

(58) Field of Classification Search
CPC ............................. H03F 3/2171; H03F 3/2173
USPC ............................................... 330/251, 207 A
See application file for complete search history.

(56) References Cited

U.S. PATENT DOCUMENTS

2002/0075072 A1   6/2002   Ishida
2003/0038674 A1   2/2003   Masuda et al.

FOREIGN PATENT DOCUMENTS

CN      1494762 A       5/2004
CN      1617440 A       5/2005
WO      2006/030569 A1  3/2006

OTHER PUBLICATIONS

International Search Report and Written Opinion for WO 2012/171938, dated Dec. 20, 2012.
Office Action and Search Report for Chinese Patent Application No. 2012800296457, dated Sep. 6, 2015, 19 pages.

*Primary Examiner* — Steven J Mottola
(74) *Attorney, Agent, or Firm* — Peter A. Nieves; Sheehan Phinney Bass + Green PA

(57) ABSTRACT

The present invention relates to a gate driver for a power transistor comprising a first charging path operatively connected between a first voltage supply and a gate terminal of the power transistor for charging the gate terminal to a first gate voltage. A second charging path is connectable between the gate terminal of the power transistor and a second supply voltage to charge the gate terminal from the first gate voltage to a second gate voltage larger or higher than the first gate voltage. A voltage of the second voltage supply is higher than a voltage of the first voltage supply.

35 Claims, 4 Drawing Sheets

POWER TRANSISTOR GATE DRIVER

The present invention relates to a gate driver for a power transistor comprising a first charging path operatively connected between a first voltage supply and a gate terminal of the power transistor for charging the gate terminal to a first gate voltage. A second charging path is connectable between the gate terminal of the power transistor and a second supply voltage to charge the gate terminal from the first gate voltage to a second gate voltage larger or higher than the first gate voltage. A voltage of the second voltage supply is higher than a voltage of the first voltage supply. Another aspect of the invention relates to a load driving assembly comprising a plurality of gate drivers electrically coupled to respective ones of a plurality of power transistors. The load driving assembly may be utilized in various power amplification applications such as class D audio amplifiers.

BACKGROUND OF THE INVENTION

Gate drivers for power transistors of a power or output stage of Class D audio amplifiers are well-known in the art. The power transistors often comprise N-channel field effect transistors such as NMOSs or IGBTs which are popular semiconductor components for the purpose due to their small ON resistance for given footprint or area consumption on a semiconductor substrate. Since the manufacturing costs of a semiconductor substrate are closely linked to its area, area reduction is an effective manner to reduce costs.

However, the design of suitable gate drivers for such N-channel field effect transistors is challenging for various reasons such as a need to raise an instantaneous gate voltage considerably above a drain voltage of the N-channel field effect transistor during operation of the power stage. The high instantaneous gate voltage is needed to turn the N-channel field effect transistor fully on. Placing the N-channel field effect transistor in its fully on-state or conducting state allows it to exhibit low on-resistance and minimize conductive power losses. Since the drain terminal of an outmost power transistor of a power stage in a Class D audio amplifier is connected to the highest DC supply voltage immediately available, often in form of a positive DC power supply voltage or rail, the instantaneous gate voltage must be raised considerably above this highest DC supply voltage for a duration of the on-state or conducting state of the power transistor in question. Bootstrap techniques and circuitry are known in the art for generating such high gate voltages in each gate driver. However, these rely on a pre-charged capacitor for supplying the gate drive voltage to the N-channel field effect transistor of the power stage. When the pre-charged bootstrap capacitor is connected to a gate terminal of an N-channel field effect transistor, its voltage is significantly reduced by the intrinsic gate capacitance of the N-channel field effect transistor due to charge sharing unless the bootstrap capacitance of the bootstrap capacitor is much larger such as 10 or 20 times larger than the intrinsic gate capacitance. However, the intrinsic gate capacitance of suitable N-channel field effect transistors for many types of power stages may be quite large such as several hundred pF, which leads to impractically large capacitance values for integrated bootstrap capacitors of acceptable dimensions, i.e. capacitance values ranging from several nF to more than 20 nF following the above-mentioned rule of thumb. As an alternative, the bootstrap capacitor can be provided externally to a semiconductor die holding the gate driver or drivers. However, this solution is undesirable since power stage topologies such as multi-level H-bridge power stages typically comprises a plurality of cascade or stacked power transistors with associated gate drivers that each need an external bootstrap capacitor. Such a plurality of external bootstrap capacitors adds to the costs of a complete Class D amplifier solution, requires allocation of valuable printed circuit board space and presents a potential reliability hazard.

Accordingly, gate drivers for power transistors, in particular N-channel field effect transistors, capable of raising the gate voltage above the positive DC power supply voltage or rail with a minimal need for external capacitors are highly desirable. In addition, a high power efficiency of the gate driver would be a significant advantage in numerous applications such as class D audio amplifiers for portable and/or battery operated communication and entertainment equipment such as mobile phones, MP3 players etc.

SUMMARY OF INVENTION

A first aspect of the invention relates to a gate driver for a power transistor. The gate driver comprises a first charging path electrically connectable between a first voltage supply and a gate terminal of the power transistor for charging the gate terminal to a first gate voltage. A second charging path is electrically connectable between a second voltage supply and the gate terminal of the power transistor for charging the gate terminal from the first gate voltage to a second gate voltage larger than the first gate voltage. A voltage of the second voltage supply is higher than a voltage of the first voltage supply.

This application of two separate charging paths for charging the gate terminal of the power transistor has the advantage that a major portion such as more than 50%, or 75%, or even more preferably more than 90%, of a total electrical charge required to raise the gate voltage to the second gate voltage can be delivered by a power efficient DC power supply comprising the first voltage supply. In this manner, only the residual portion of the total charge need to be supplied by a less power efficient high voltage supply comprising the second voltage supply. The high voltage is typically supplied by a voltage pump or voltage multiplier capable of raising the high voltage supply to a voltage level above the highest otherwise available positive DC supply voltage. As previously explained, the high voltage level delivered by the high voltage supply is required at the gate input or terminal of an N-channel field effect transistor (FET) to switch the N-channel FET into its conducting state. The first and second charging paths may both be operative to supply charging current to the gate terminal of the power transistor when the gate voltage is below the first gate voltage but the charging current supplied through the first charging path is preferably much larger than the charging current supplied through the second charging path in this situation. In one preferred embodiment, the charging current delivered by the second charging path to the gate terminal of the power transistor is substantially zero or insignificant, such as less than 10 µA or 1 µA, when the gate voltage is below the first gate voltage. This may for example be achieved by arranging a controllable MOS transistor switch in series in the second charging path where the very large off-resistance of the MOS transistor switch can be used to essentially disrupt any flow of charging current through the second charging path. When the gate voltage of the power transistor is above the first gate voltage the supply of charging current through the first charging path is preferably essentially zero because of the connection of the first charging path to the first voltage supply which may have a voltage level close to a level of the first gate voltage. The level of the first gate voltage is preferably set to about the same level as the voltage level of the first voltage supply to maximize the amount of charging current supplied by the first charging before the gate voltage of the power transistor reaches the voltage level of the first voltage supply. At that condition, the first charging path is unable of supplying further charging current to the gate terminal due to a reversal of the flow of charging current. Consequently, the further supply of charging current to the gate terminal so as to raise the gate voltage of the power transistor from the first gate voltage to the second gate voltage is effected through the second charging path. Since a distal node of the second charging path is connected to the second supply voltage which is higher than both first supply voltage and the first gate voltage, charging current can at least flow from the second supply voltage to the gate terminal of the power transistor until the gate voltage is close to the second supply voltage.

The present gate driver is highly useful to drive a gate of an N-channel FET of a switched power stage or load driver. The present gate driver may be utilized for single-ended or H-bridge load driving circuits of a class-D audio amplifier. The class D audio amplifier may comprise 2-level class AD or BD PDM or multi-level PWM in various power stage topologies.

According to a preferred embodiment, the first voltage supply comprises a drain voltage of the power transistor so as to provide an electrical coupling from a drain terminal of the power transistor to its gate terminal through the first charging path. In some embodiments, the drain terminal of the power transistor may be coupled directly to a positive DC supply voltage of an output stage comprising the power transistor. In other embodiments, the drain terminal of the power transistor may be coupled to an intermediate supply voltage such as a drain terminal coupled to flying capacitor in a multi-level PWM output stage topology where the drain terminal voltage level is set by a voltage of the flying capacitor. The gate driver may be adapted to operate across a wide range of DC supply voltages, i.e. a voltage difference between the second supply voltage and the lowest supply voltage of the gate driver, depending on requirements of a particular application. In a range of useful applications, the DC supply voltage may be set to value between 5 Volt and 120 Volt. The DC supply voltage may be provided as a unipolar or bipolar DC voltage for example +40 Volt or +/−20 Volt relative to a ground reference, GND.

The gate driver preferably comprises a voltage multiplier or charge pump adapted to generate the second voltage supply based on a DC supply voltage of the gate driver. The DC supply voltage may for example comprise a normal CMOS power supply rail with a DC voltage between 3.0 and 5.0 Volt. The voltage multiplier or charge pump may charge a flying capacitor to the latter DC voltage and stack the charged capacitor on top of the first supply voltage to thereby generate a second supply voltage which is between 3 and 5 V higher than the first supply voltage.

The gate driver preferably comprises a controllable discharge path adapted to switch the power transistor to an off-state or non-conducting state where the controllable discharge path is connectable between the gate terminal of the power transistor and a source terminal of the power transistor. The discharge path may comprise a MOS switch that is switched between its conducting and non-conducing state by manipulation of its gate voltage. The discharge path ensures that the power transistor can rapidly brought into its non-conducting state by removing the charge on the gate terminal supplied through the first and second charging paths to switch the power transistor ON as explained above.

According to yet another preferred embodiment, the gate driver comprises a controller or sequencer adapted to control supply of charging current to the gate terminal through the first charging path and control supply of charging current to the gate terminal through the second charging path. The controller may, optionally, control the off-state and on-state of the controllable discharge path. The controller may be a relatively simple circuit based on combinational logic operating asynchronously to any clock signal available to the gate driver. In this embodiment the controller may operate according to a self-timed mechanism and comprise a handful of appropriately configured transistors and circuitry to define a voltage level of the first voltage. However, in other embodiments, the controller may comprise clocked sequential logic operating synchronously to a master or other system clock signal available to the gate driver. In the latter embodiment, the controller may for example comprise programmable logic circuitry or a software programmable or hard-wired Digital Signal Processor (DSP) or general purpose microprocessor.

In one embodiment, a predetermined threshold voltage is provided to the controller to set the first voltage and the controller is adapted to control the supply of charging currents to the gate terminal through the first and second charging paths by comparing the gate voltage of the power transistor with the predetermined threshold voltage. The predetermined threshold voltage may for example be derived from a drain voltage of a power transistor electrically coupled to the first charging path. The predetermined threshold voltage may be set to a voltage level about one MOS threshold voltage below a drain voltage of the power transistor. In practice, the predetermined threshold voltage will then typically be situated between 0.5 and 1.0 V below a drain voltage of the power transistor. This embodiment allows the first voltage of a given gate driver to be conveniently adapted to the actual voltage level of its associated power transistor.

In another embodiment, the first voltage may be defined by a timing scheme rather a particular preset threshold voltage. According to the timing based scheme, the controller is adapted to supply charging current to the gate terminal of the power transistor through the first charging path for a predetermined charging time period, such as a charging time period between 5 and 100 nanoseconds, to reach the first gate voltage. Subsequently, the controller supplies charging current to the gate terminal through the second charging path for a predetermined time period. An approximate charging time period may be computed based on knowledge of an approximate impedance of the first charging path and an approximate value of the capacitance at the gate terminal of the power transistor. This capacitance will typically comprise capacitance contributions for the gate terminal and the gate to drain capacitance.

The flow of charging current through each of the first and second charging paths may conveniently be controlled by a series-coupled switch element for example embodied as a controllable semiconductor switch such as a FET transistor controlled by the controller or sequencer. The controllable FET transistor may comprise one or more NMOS or PMOS transistor(s) which conveniently may be integrated on a semiconductor substrate and exhibit low on-resistance and high off-resistance.

In one embodiment, the controller is adapted to disrupt the supply of charging current from the second voltage supply until the gate voltage reaches the first gate voltage. This scheme is advantageous because it usually ensures that a major portion of the required charge to the gate terminal is delivered by a power efficient first voltage supply such as a positive DC power supply. Consequently, only a relatively small fraction of the entire gate charge is supplied by a less power efficient high voltage supply providing the second voltage supply.

The voltage or voltage level of the second voltage supply is preferably at least one gate-to-source voltage drop of the power transistor higher than a voltage of the first voltage supply during a conducting state or on-state of the power transistor. To ensure that the voltage level of the second voltage supply is sufficiently high to ensure the power transistor is appropriately placed in its conducting state, the voltage of the second voltage supply may be at least 2 Volt, preferably 3 Volt, or even more preferably 5 Volt, higher than the voltage of the first voltage supply during a conducting state or on-state of the power transistor.

The first charging path is preferably adapted to charge the gate terminal of the power transistor to the first gate voltage in less than 100 nanoseconds, preferably less than 50 nanoseconds, or even more preferred less than 20 nanoseconds. This range of charging times are well-suited for controlling switched power transistors of a power stage operating with PWM or PDM switching frequencies in the range 100 kHz to 10 MHz.

Since the voltage level of the first voltage supply may fluctuate considerably during operation of the gate driver, the second voltage supply is preferably adapted such that it is at least 2.5 Volt higher than the voltage on first voltage supply at all times during operation of the gate driver. This ensures that sufficient voltage is always available for switching the power transistor to its conducting state and maintaining the power transistor therein during the intended operation of the gate driver.

In a particularly advantageous embodiment of the invention relates to a load driving assembly comprising a plurality of gate drivers according to any of the above described embodiments thereof. The load driving assembly further comprises a plurality of power transistors each having a gate terminal electrically connected to a first node of the first charging path and to a first node of the second charging path of a gate driver. A drain terminal of each power transistor is electrically coupled to a second node of the first charging path to provide the first supply voltage for the power transistor. A plurality of assembly input terminals is coupled to respective inputs of the plurality of gate drivers to supply modulated input signals thereto. The plurality of power transistors are coupled in cascade with an upper leg formed between a first DC supply voltage and an output terminal and a lower leg formed between the output terminal and the second DC supply voltage such that the output terminal is electrically coupled between the upper and lower legs.

The load driving assembly may be connected directly to a loudspeaker load coupled to the output terminal. The load driving assembly may for example comprise between 2 and 8 cascaded power transistors each having its drain and gate terminals coupled to a separate gate driver. According to a preferred embodiment of the load driving assembly, the second voltage supplies of the plurality of gate drivers are electrically connected to a common charge pump capacitor of the second voltage supply. This embodiment allows the plurality of second charging paths to receive their respective charging currents from a single shared high voltage supply requiring only a single capacitor. Consequently, since a typical load driving assembly may comprise more than 4 cascaded power transistor such as 6, 8 or even more, the ability to share the second voltage from a single capacitor based high voltage supply reduces the need for bootstrap capacitor to drive the gate terminals of the power transistors. So despite the common charge pump capacitor may have a considerable capacitance value such as between 10 nF and 100 nF, which requires it to be an external component to the load driving assembly, only a single capacitor component is required.

The present load driving assembly is particularly useful for application in multi-level PWM or PDM output or power stages because of their utilization of multiple stacked or cascaded power transistors. The load driving assembly may be adapted to operate at a DC voltage difference between 5 Volt and 120 Volt between the first and second DC supply voltages. According to one embodiment of the load driving assembly, adapted for use as a multi-level PWM power stage, a DC voltage source is configured to set a predetermined DC voltage difference between a first node, situated between a pair of cascaded power transistors of the upper leg and a second node, situated between a pair cascaded power transistors of the lower leg. The DC voltage source may conveniently comprise at least one device or component selected from a group of {a charged capacitor, a floating DC supply rail, a battery}. The predetermined DC voltage difference is preferably substantially equal to one half of a DC voltage difference between the first and second DC supply voltages so as to enable the generation of a 3-level output signal at the output terminal. In one embodiment, the DC voltage source comprises a charged capacitor with a capacitance between 100 nF and 10 μF. The plurality of power transistors preferably comprises at least one N-channel field effect transistor such as a NMOS or IGBT deposited on semiconductor substrate such as Silicon, Gallium Nitride or Silicon Carbide. Preferably, all power transistors of the load driving assembly are embodied as N-channel field effect transistor.

According to yet another advantageous embodiment of the invention, the load driving assembly is formed or integrated on a semiconductor substrate such as CMOS integrated circuit, preferably in a semiconductor process that supports high voltage devices. The semiconductor substrate provides a robust and low-cost single chip solution for the manufacture of the load driving assembly which is particularly well-suited for high-volume consumer oriented audio applications, such as TV sets, mobile phones and MP3 players, where cost is an essential parameter. The semiconductor substrate preferably comprises a voltage supply terminal providing electrical connection to the external charge pump capacitor acting as an energy reservoir for the second voltage supply.

Another aspect of the invention relates to a class D audio amplifier comprising one of the above-described embodiments of the load driving assembly. As previously mentioned, the Class D audio amplifier may comprise modulators for two-level or multi-level PWM or PDM.

BRIEF DESCRIPTION OF THE DRAWINGS

A preferred embodiment of the invention is described in more detail below in connection with the appended drawings, in which.

DETAILED DESCRIPTION OF PREFERRED EMBODIMENTS

Figure 1:
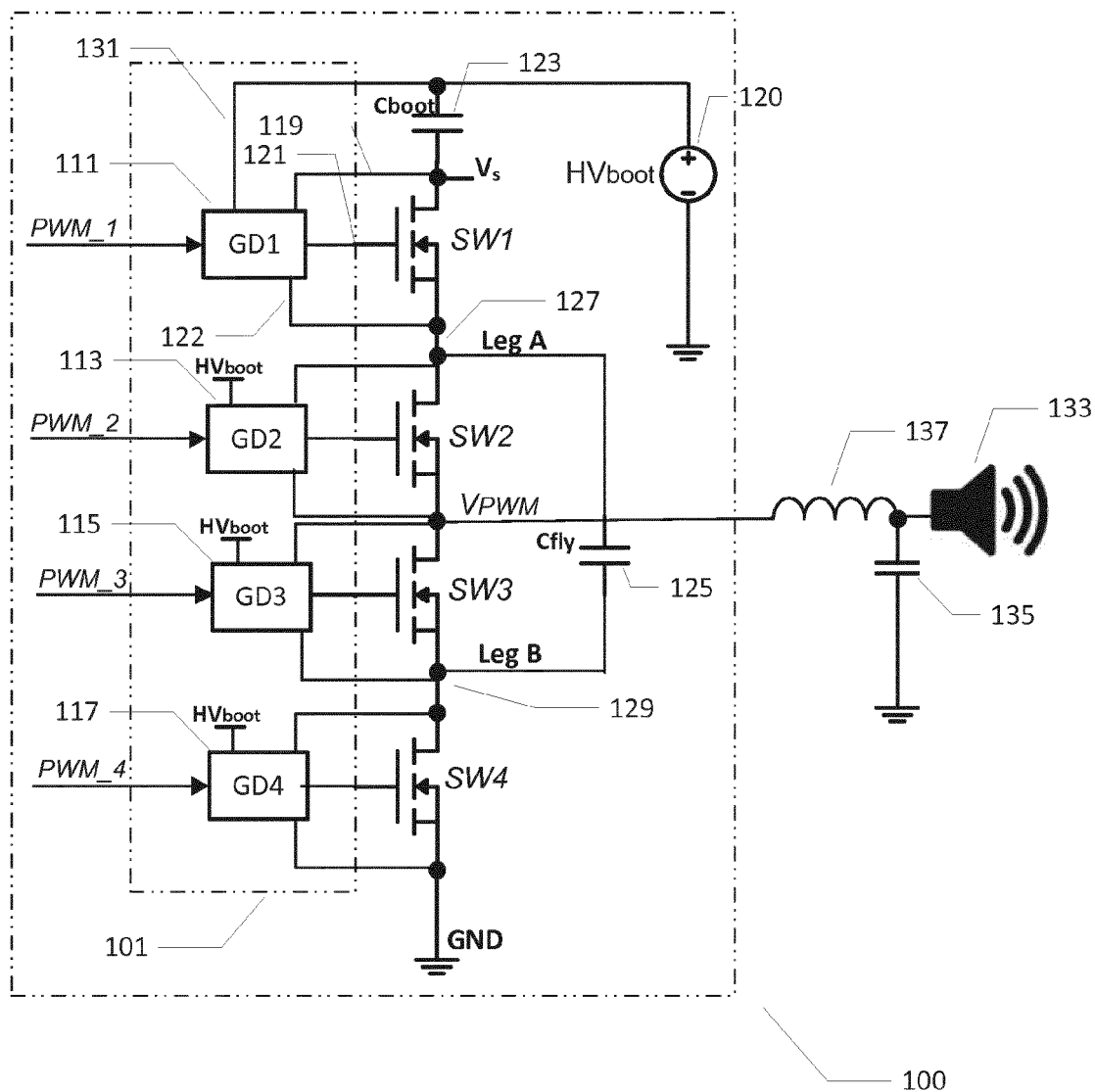
FIG. 1 is a schematic diagram of a load driving assembly comprising a plurality of gate drivers in accordance with a preferred embodiment of the invention and electrically coupled to respective gate terminals of a plurality of power transistors.

FIG. 1 illustrates schematically a load driving assembly 100 connected to a loudspeaker load 133. The load driving assembly 100 comprises a gate driving circuit 101 comprising four individual gate drivers 111, 113, 115, 117 in accordance with a preferred embodiment of the present invention. Each of the gate drivers has an output terminal electrically connected to a gate terminal of one of NMOS transistors SW1, SW2, SW3, SW4. The NMOS transistors SW1, SW2, SW3, SW4 are coupled in cascade between a first or positive DC supply voltage $V_S$ and a second DC supply voltage in form of ground, GND. The cascaded NMOS transistors SW1, SW2, SW3, SW4 form a load driver for the loudspeaker load 133 coupled to an output terminal $V_{PWM}$ of the load driver through a load inductor 137 and a load capacitor 135. The combined operation of the load capacitor and load inductor 135, 137, respectively, is to provide lowpass filtering of a multi-level pulse width modulated output signal waveform provided at the output terminal $V_{PWM}$ so as to suppress carrier or switching frequency components in an audio signal across the loudspeaker load 133.

In the present embodiment of the invention, the gate driving circuit 101 and the load driver, comprising cascaded NMOS power transistors SW1, SW2, SW3, SW4, are integrated on a common semiconductor substrate or die such that the depicted electrical connections between each of the gate drivers 111, 113, 115, 117 and its associated NMOS power transistor is provided on the semiconductor substrate. However, the skilled person will understand that the load driver may be formed as an entirely separate circuit from the gate driving circuit 101, for example as a separate semiconductor substrate or integrated circuit. In the latter embodiment, the depicted electrical connections between each of the gate drivers 111, 113, 115, 117 and its associated NMOS transistor may be provided by electrical traces on a printed circuit board (PCB), ceramic substrate or similar carrier. The skilled person will appreciate that each of the cascaded NMOS transistors SW1, SW2, SW3, SW4 may be composed of a single MOS transistor as schematically illustrated on FIG. 1 or may in other embodiments of the invention comprise a plurality of smaller parallelly coupled individual NMOs transistors.

The skilled person will understand that the depicted single-ended multi-level load driving assembly 100 could be expanded to provide an H-bridge load driving assembly based on a pair of essentially identical load driving circuit assemblies 100 connected to opposite terminals of the loudspeaker load 133. Likewise, the skilled person will understand that the four gate drivers 111, 113, 115, 117 could be used to drive gate terminals of other topologies of switched power stages such as PDM or 2-level class AD or BD PWM modulation.

In the present embodiment, the load driver comprises an upper leg A which comprises the pair of cascaded NMOS transistors SW1, SW2 while a lower leg B comprises the pair of cascaded NMOS transistors SW3, SW4. The cascaded NMOS transistors SW1, SW2 are coupled to $V_S$ at a drain terminal of SW1 and to the output terminal or node $V_{PWM}$ at a source terminal of SW2. The NMOS transistor SW3 has its drain terminal coupled to the output terminal or node $V_{PWM}$ and a source terminal of SW4 is coupled to GND. The load driver furthermore comprises a charged so-called flying capacitor $C_{fly}$ 125 that enables the generation of a third output level midway between $V_S$ and GND at the output node $V_{PWM}$ to provide a multi-level PWM signal as explained in further detail in the applicant's co-pending U.S. patent application No. 61/407,262. During operation of the load driving assembly 100, a signal generator or modulator is configured to apply first, second, third and fourth pulse width modulated control signals of appropriate amplitude and phase to first, second, third and fourth inputs PWM_1, PWM_2, PWM_3, PWM_4, of the gate drivers 111, 113, 115, 117, respectively, so as to controlling respective states of the cascaded NMOS transistors SW1, SW2, SW3, SW4. Thereby, each of the NMOS transistors SW1-SW4 toggles or switches between ON-states and OFF-states in accordance with transitions of the pulse width modulated control signal in question. The on-resistance of each NMOS transistors SW1, SW2, SW3, SW4 in its ON-state/conducting state may vary considerably according to requirements of a particular application, in particular an impedance of the loudspeaker load 133 or an impedance of another type of inductive and/or capacitive load. In the present embodiment each of the NMOS transistors is preferably designed such that its on-resistance lies between 0.01 and 5 ohm such as between 0.05 and 0.5 ohm.

The load driving assembly 100 comprises a voltage multiplier or charge pump 120, $HV_{boot}$, adapted to generate a high voltage supply based on a positive DC supply voltage $V_S$. The positive DC supply voltage $V_S$ may vary widely, for example between 5 and 100 Volts, according to requirements of particular applications but in the present embodiment of the invention it is fixed at about 40 Volt. The high voltage generated by the charge pump 120 is preferably set to voltage about 5 Volt higher than the positive DC supply voltage $V_S$ and distributed to each of the gate drivers 111, 113, 115, 117. In each gate driver, the high voltage is utilized to generate a gate drive signal or gate voltage above the positive DC supply voltage $V_S$ so as to drive each of the NMOS transistors SW1, SW2, SW3, SW4 into a low-resistance conducting state in accordance with the first, second, third and fourth pulse width modulated control signals, respectively, as explained in further detail below. A power supply or pump capacitor 123, $C_{boot}$, which is coupled to the high voltage supply at one end and to the positive DC supply voltage at the opposite end to provide an energy reservoir for the high voltage supply, $HV_{boot}$. The charge pump 120 comprises a flying capacitor (not shown) that intermittently is charged to a voltage of about 3 Volt or 5 Volt above ground from a suitable DC supply voltage of the load driving assembly 100. The flying capacitor is intermittently disconnected from the DC supply voltage and electrically connected to $C_{boot}$ to dump acquired charge thereon and thereby raise the high voltage at $HV_{boot}$ to approximately 3 Volt or 5 Volts above the positive DC supply voltage $V_S$ The power supply capacitor 123 may either be an external component to the load driving assembly 100 or integrated on the semiconductor substrate holding the gate driver circuit 101 depending on size and cost requirements dictated by a particular application. The capacitance of an external power supply capacitor 123 is preferably set to a value between 10 nF and 100 nF.

As illustrated, each of the gate drivers 111, 113, 115, 117 comprises three separate electrical connections to the drain, gate and source nodes, respectively, of respective ones of the NMOS transistors SW1, SW2, SW3, SW4. For the upper-most gate driver 111, GD1, electrical conductors 119, 121 and 122 connect to the drain, gate and source nodes of NMOS transistor SW1. The gate terminal of SW1 is charged through two independent charging paths, i.e. a first charging path and a second charging path, provided within the gate driver GD1 as explained in further detail below with reference to FIGS. 2 and 3.

Figure 2:
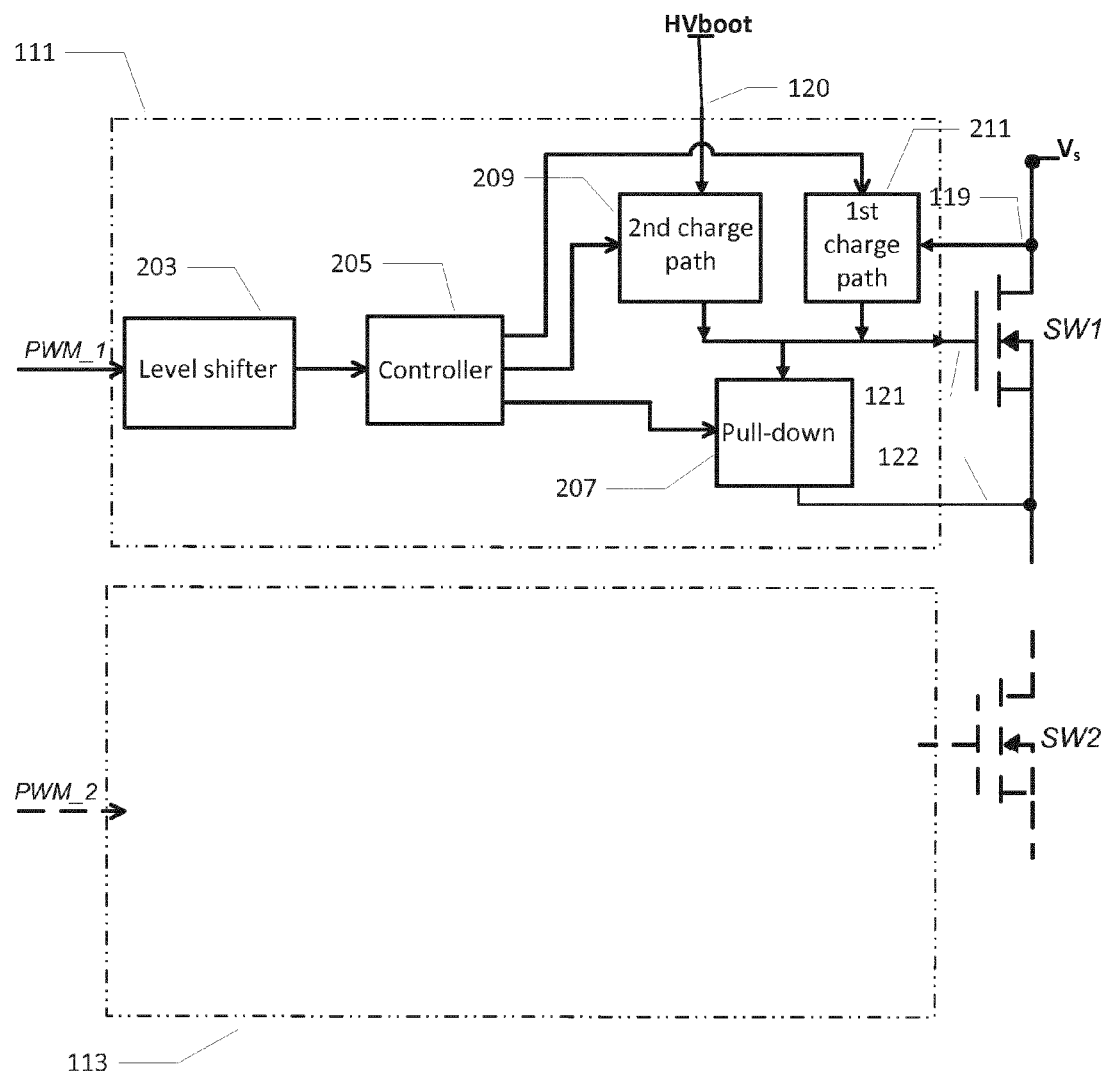
FIG. 2 is a schematic diagram of a single gate driver coupled to a gate terminal of an associated power transistor in accordance with the preferred embodiment.

FIG. 2 is a schematic diagram of a single gate driver 111 (GD1) coupled to the gate terminal of a power transistor. The gate driver 111 comprises the previously-mentioned input for a pulse width modulated audio signal PWM_1. The pulse width modulated audio signal is applied to a level shifter 203 that can shift a DC voltage level of the pulse width modulated audio signal and/or increase an amplitude thereof to provide an output signal suitable for driving the NMOS power transistor SW1 through the residual gate driver circuitry. The output signal is applied to a controller or sequencer 205 which is adapted to control supply of charging current to the gate terminal 121 through a first charging path 211 and control supply of charging current to the gate terminal 121 through a second charging path 209. In addition, the controller or sequencer 205 is adapted to control the OFF-state and ON-state of a controllable discharge path 207 electrically connected between the gate terminal 121 and the source terminal 122 of the NMOS power transistor SW1. Charging current is supplied from the drain terminal 119 to the gate terminal 121 through the first charging path 211 in accordance with control signal from the controller 205. Since the drain terminal of SW1 is electrically coupled to the positive DC supply voltage $V_S$ the charging current is supplied from a low impedance voltage source with ample of power. In the present embodiment, the controller 205 is adapted to control the supply of charging currents to the gate terminal through the first and second charging paths by comparing a gate voltage on the gate terminal 121 with a predetermined threshold voltage. When the gate voltage is below predetermined threshold voltage, the controller 205 enables the first charging path 211 and disrupts the supply of charging current from the high voltage supply, $HV_{boot}$, through the second charging path 209. Once the gate voltage reaches the predetermined threshold voltage, the first charging path 211 is disrupted or disconnected by the controller 205 and the second charging path 209 enabled such that additional charging current is supplied to the gate terminal from the high voltage supply via the second charging path 209. In this manner, the second charging path 209 is able to lift or raise the gate voltage of the NMOS power transistor SW1 considerably above the positive DC supply voltage. The threshold voltage may in practice be selected quite freely and defined by any one of several different mechanisms. However, in the present embodiment, the predetermined threshold voltage of each gate driver is derived from the drain voltage of the associated NMOS power transistor. The predetermined threshold voltage is fixed at approximately a single MOS transistor threshold voltage below the drain voltage of the NMOS power in question. This single threshold voltage may correspond to a voltage between 0.5 and 1.5 Volt for typical CMOS integrated circuit technologies. It is generally advantageous to set the predetermined threshold voltage close to the drain voltage of the associated power transistor. This setting ensures the power transistor is operating close to its conducting state or ON-state when the drain voltage approximately equals the gate voltage. This scheme normally ensures that a major portion of the required charge current to the gate terminal is delivered by the power efficient DC power supply of the output stage, i.e. the positive DC supply voltage $V_S$ in the present embodiment, while only a relatively small fraction of the entire gate charge current is supplied by the less power efficient high voltage supply. The time period for charging the gate terminal of the NMOS power transistor SW1 to approximately the voltage of high voltage supply, $HV_{boot}$, may be lie between 1 and 20 ns. Once the NMOS power transistor SW1 has been switched to its conducting state by the combined operation of the first and second charging paths it remains in that state for a time period defined by the pulse width of the pulse width modulated audio signal PWM_1. When a down going edge or transition is detected in the pulse width modulated audio signal by the controller 205 the discharge path 207 is activated so as to effectively short the gate terminal 121 to the source terminal 122 by a low resistance path. Consequently, the activation of the discharge path 207 discharges the gate voltage and switches the NMOS power transistor SW1 to a non-conducting state.

Figure 3:
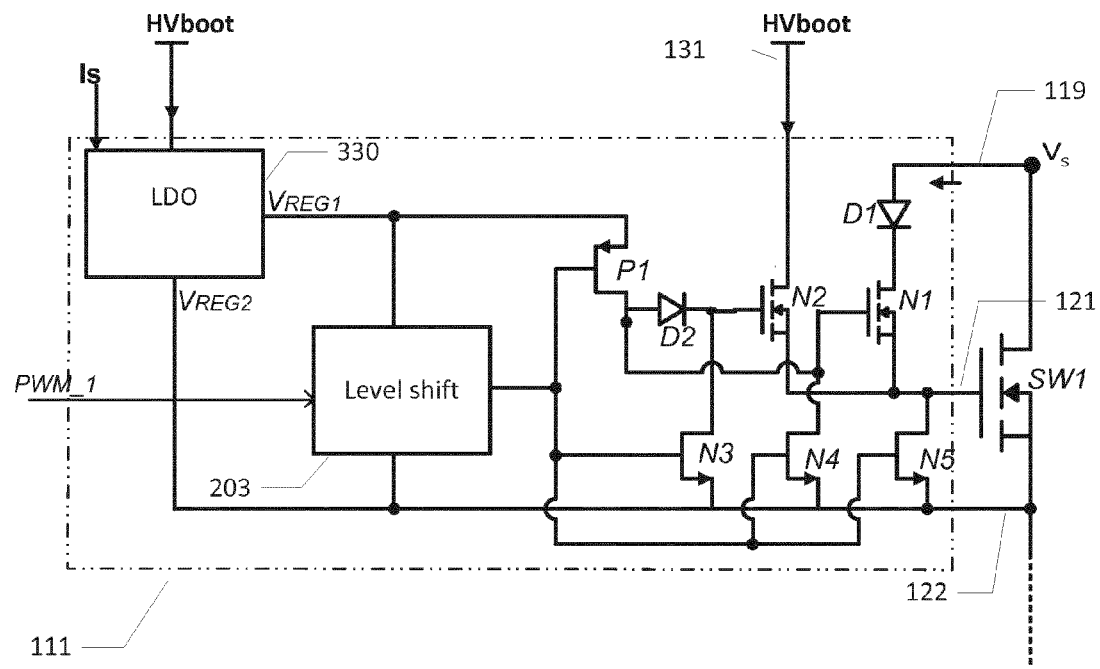
FIG. 3 is a mixed block and transistor level diagram of the single gate driver depicted schematically on FIGS. 1 and 2.

FIG. 3 is a mixed block and transistor level diagram of the single gate driver 111, GD1, depicted schematically on FIGS. 1 and 2. The first charging path 211 and the second charging path 209 on FIG. 2 are here depicted on transistor level while the level shifter 203 and a linear voltage regulator 330 are depicted as circuit blocks for simplicity. The skilled person will appreciate that the controller 205 of FIG. 2 is formed by the MOS transistors P1, N3, N4, and N5. The gate driver 111 is implemented as a floating circuit block relative to ground and is well-suited for integration in a high voltage portion of a CMOS semiconductor substrate such as within a high voltage isolation well. The linear voltage regulator 330 or LDO is coupled to the high voltage supply, $HV_{boot}$, and preferably adapted to generate a regulated DC supply between 3 Volt and 5 Volt between output terminals $V_{REG1}$ and $V_{REG2}$. A start current, for example between 0.1 and 1 mA, is supplied through input $I_s$ to start-up or boot the linear voltage regulator 330. The operation of the first charging path 211 is controlled through switching of the NMOS transistor N1 which is controllable by manipulation or steering of its gate terminal. The gate terminal of N1 is coupled to a drain of NMOS transistor N4 such that N4 is able to switch N1 between its conducting and non-conducting state. N4 is controlled by the output signal of the level shifter 203 which output signal is a pulse width modulated audio signal switching between regulated voltage levels of $V_{REG1}$ and $V_{REG2}$ as previously explained. When the output signal is logic low, i.e. the voltage $V_{REG2}$, N1 is placed in its conducting state because N4 is non-conducting or OFF while P1 is conducting and thereby pulling the gate terminal of N1 towards $V_{REG1}$ to provide a positive gate-source voltage to N1. Since N1 is conducting, the gate terminal of NMOS power transistor SW1 is charged by charging current supplied from the positive DC supply voltage $V_S$ through N1 and forward biased series connected diode D1. Due to a substantial capacitance, such as between 50 pF and 500 pF or about 100 pF, of the gate terminal of N1 in the present embodiment of the invention, the charging current may reach peak values of 150 mA or more. The charging current raises the gate voltage on the gate terminal of NMOS transistor SW1 until it reaches a voltage about one diode drop below the positive DC supply voltage which also is equal to the drain voltage of SW1 in the present gate driver 111. Thereafter N1 switches to a non-conducting state since the gate-source voltage approaches zero. This voltage is accordingly a threshold voltage. During the time period where the gate terminal of SW1 is charged through the first charging path, the second charging path which comprises NMOS transistor N2 is also active to supplying charging current to the gate terminal of SW1 because N2 is placed in a conducting state by the PMOS transistor P1 which pulls a gate terminal of N2 to the regulated supply voltage $V_{REG1}$. However, forward biased diode D2, possibly combined with the relative sizes of N1 and N2, ensures that the gate-source voltage drop across N2 is significantly smaller than the gate-source voltage drop across N1 so as to ensure that a majority of the charging current to the gate terminal of SW1 is supplied through N1 or the first charging path when the gate voltage of SW1 is below the above-mentioned threshold voltage. A total charge between 1 and 10 nC may be provided to the gate terminal of SW1 to fully charge it. This total charge is consumed to both charge the gate source capacitance and a gate-drain capacitance of SW1.

Once the gate voltage on SW1 has reached the threshold voltage N1 is switched to its non-conducting state while NMOS transistor N2 is maintained in its conducing state. Consequently, further charging current is supplied to the gate terminal 121 of SW1 from the high voltage supply, $HV_{boot}$ through the drain source terminals of N2 arranged in the second charging path. The high voltage supply, $HV_{boot}$ has a substantially higher voltage than the positive DC supply voltage $V_S$ for example between 3 and 5 Volt higher, preferably about 4.5 Volt in the present embodiment. During charging of the gate terminal 121 of SW1 through N2, the diode D1 blocks any unintended flow of current through N1 back to the positive DC supply voltage connected to the drain of SW1. The gate terminal of SW1 is accordingly charged through N2 until it reaches a voltage about one diode drop, i.e. about 0.5-0.8 Volt, below the regulated voltage $V_{REG1}$ due to forward biased diode D2. Consequently, the gate terminal of SW1 is raised to a voltage approximately equalling one diode drop below the regulated voltage $V_{REG1}$ and since the latter voltage is approximately equal to the voltage level of the high voltage supply, $HV_{boot}$, the gate voltage of SW1 is driven to a level about 4 Volt above the positive supply voltage. Thus, allowing SW1 to be fully conducting and thereby exhibiting a very low on-resistance.

When SW1 has been turned on or conducting, by the above-described operation of the first and second charging paths, for a certain time period set by the pulse width of the output signal of the level shifter 203, the output signal abruptly changes to logic high or the voltage level set by $V_{REG1}$. In response SW1 is to be switched to its non-conducting state and the supply of charging current through both N1 and N2 to be disrupted. This function is achieved because P1 switches to its non-conducting state in response to a logic high signal at the output of the level shifter 203 and N4 switches to its conducting state because the gate-source voltage across this NMOS device is forced to about 4.5 Volt which is the difference between the regulated voltage supply terminals as previously mentioned. N4 in turn pulls the gate of N1 down to $V_{REG2}$ which switches N1 to a non-conducting state since its gate-source voltage approaches zero. The non-conducting state of N1 disrupts the first charging path to cut off the supply of charging current to the gate terminal of SW1. Simultaneously, N3 pulls the gate of N2 down to the voltage $V_{REG2}$ which switches N2 to its non-conducting state since its gate-source voltage across this MOS transistor also approaches zero and therefore disrupts the second charging path. Thus, the supply of charging current to the gate terminal of SW1 through this path is also disrupted. Finally, the gate and source of SW1 is short circuited by N5 that is switched to its conducting state by the logic high level applied at its gate terminal. Thereby, SW1 is switched to its non-conducting or OFF-state and charge on the gate terminal removed.

The skilled person will understand that the controller 205 in the present embodiment of the invention is a relatively simple but effective circuit based on combinational logic operating asynchronously to any clock signal of the load driving assembly. However, the skilled person will understand that the controller can be implemented in other ways for example using clocked sequential logic operating synchronously to a master or other system clock signal available to the load driving assembly. In the latter embodiment, the controller 205 may for example comprise a software programmable or hard-wired Digital Signal Processor (DSP) or general purpose microprocessor.

Figure 4:
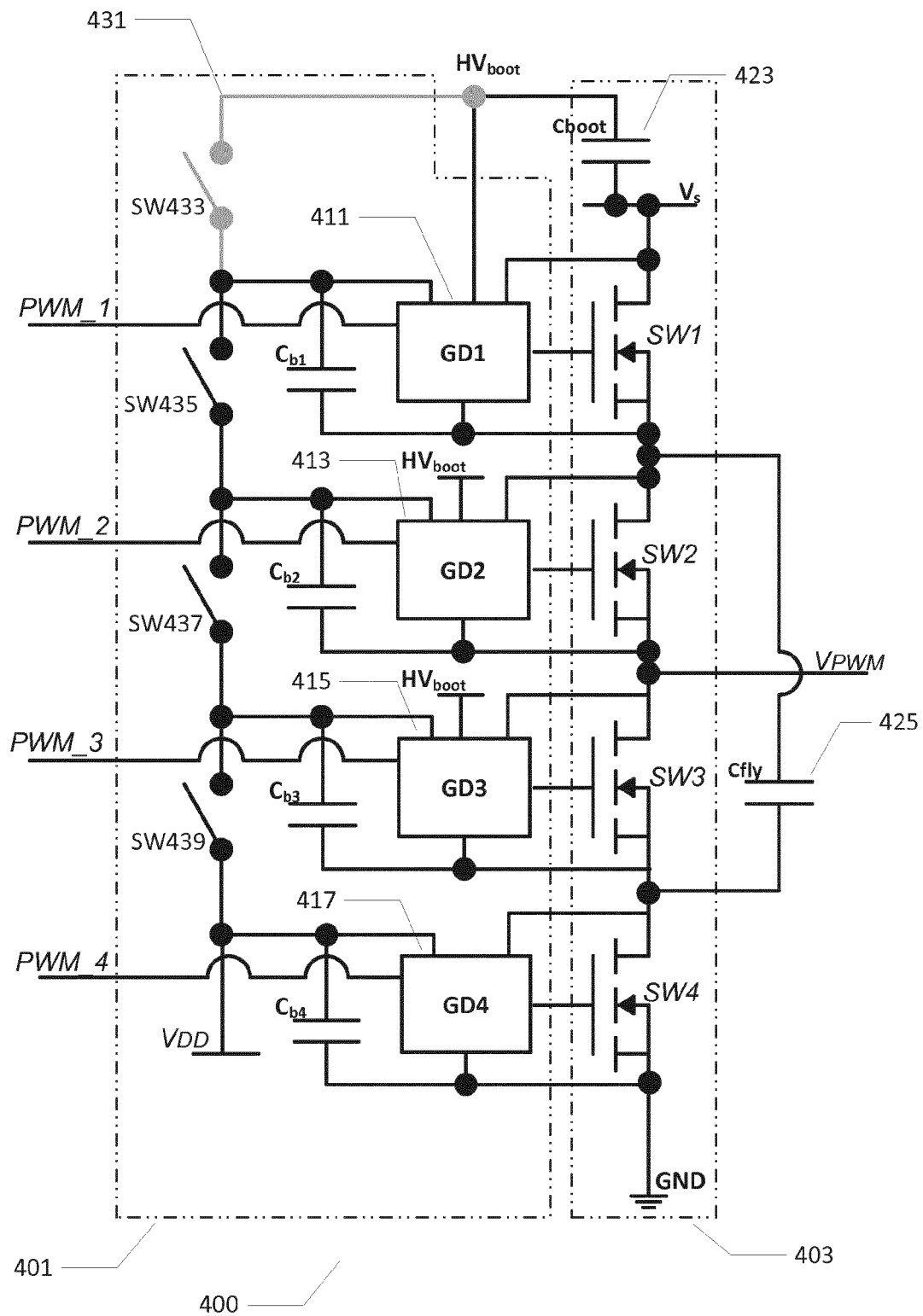
FIG. 4 is a is a schematic diagram of a load driving assembly comprising a plurality of gate drivers in accordance with a second preferred embodiment electrically coupled to respective gate terminals of a plurality of power transistors.

FIG. 4 is a is a schematic diagram of a load driving assembly 400 comprising a plurality of gate drivers GD1, GD2, GD3, GD4 411, 413, 415 and 417, respectively, in accordance with a second preferred embodiment of the invention. The load driver 403 comprises a cascade of four NMOS power transistors SW1, SW2, SW3, SW4 similar to that described in connection with the first embodiment of the invention. Furthermore, the plurality of gate drivers GD1, GD2, GD3, GD4 in the present load driving assembly embodiment has the same overall topology as the gate drivers GD1, GD2, GD3, GD4 previously described in detail in connection with the first preferred embodiment of the invention. However, in the present embodiment the LDOs 330 (FIG. 3) of each gate driver has been replaced with a bootstrap ladder circuit comprising cascaded transistor switches sw433, sw435, sw437, sw439 and bootstrap capacitors $C_{b1}$, $C_{b2}$, $C_{b3}$ and $C_{b4}$. The bootstrap ladder is more power efficient than the LDOs because conduction of current in each of the transistor switches is avoided while there exists any significant voltage drop across the switch. Thus, current conduction in a transistor switch is preferably avoided when the voltage drop across the switch in question is above 0.5 Volt or above 1.0 Volt. Each of the transistor switches sw433, sw435, sw437, sw439 is placed in its conducting state by a suitable control signal when the associated gate driver is active to drive the power NMOS transistor. The cascaded transistor switches sw433, sw435, sw437, sw439 are electrically coupled between a low voltage DC supply, $V_{DD}$, and high voltage supply, $HV_{boot}$, provided through power line conductor 431 and similar to the previously described high voltage supply. The high voltage supply, $HV_{boot}$, includes supply capacitor $C_{boot}$ 423. The low voltage DC supply, $V_{DD}$, may in practice be derived from an available normal DC power supply for CMOS logic circuitry of a class-D amplifier comprising the present load driving assembly 400 for example a 1.8, 3.3 or 5 Volt DC power supply. The lowermost gate driver GD4 is supplied with power directly from this DC power supply as illustrated and the output voltage of the DC power supply utilized high voltage supply for a second charging path of this gate driver. This is possible because the gate input of the power transistor SW4 does not need to be raised or driven to a voltage above the positive DC supply voltage $V_S$ to switch SW4 into a conducting state. The drain of SW4 is only charged to about one-half of $V_S$ as a consequence of the utilized multi-level output stage topology around $C_{fly}$ 425. The uppermost gate driver GD1 is supplied by a high voltage supply $HV_{boot}$ through transistor switch SW433, or by Cb2 through transistor switch sw435. The inclusion of SW433 provides an extra voltage supply input to the bootstrap ladder so as to reducing a total capacitance required for the bootstrap capacitors $C_{b1}$, $C_{b2}$, $C_{b3}$ and $C_{b4}$.

The invention claimed is:

1. A gate driver for a power transistor, comprising:
a first charging path electrically connectable between a first voltage supply and a gate terminal of the power transistor for charging the gate terminal to a first gate voltage;
a second charging path electrically connectable between a second voltage supply and the gate terminal of the power transistor for charging the gate terminal from the first gate voltage to a second gate voltage larger than the first gate voltage; and
a controllable discharge path adapted to switch the power transistor to an OFF-state/non-conducting state, wherein the controllable discharge path is connectable between the gate terminal of the power transistor and a source terminal of the power transistor, wherein a voltage of the second voltage supply is higher than a voltage of the first voltage supply.

2. A gate driver according to claim 1, wherein the first voltage supply comprises a drain voltage of the power transistor.

3. A gate driver according to claim 1, comprising a voltage or charge pump adapted to generate the second voltage supply based on a DC supply voltage of the gate driver.

4. A gate driver according to claim 1, comprising a controller or sequencer adapted to control supply of charging current to the gate terminal through the first charging path and control supply of charging current to the gate terminal through the second charging path, and optionally, the OFF-state and ON-state of the controllable discharge path.

5. A gate driver according to claim 4, wherein the controller or sequencer is adapted to control the supply of charging currents to the gate terminal of the power transistor through the first and second charging paths by comparing the gate voltage of the power transistor with a predetermined threshold voltage.

6. A gate driver according to claim 5, wherein the controller or sequencer is adapted to derive the predetermined threshold voltage from a drain voltage of the power transistor electrically coupled to the first charging path.

7. A gate driver according to claim 4, wherein the controller or sequencer is adapted to:
supply charging current to the gate terminal of the power transistor through the first charging path for a predetermined charging time period such as a time period between 5 and 100 nanoseconds to reach the first gate voltage; and
subsequently supply charging current to the gate terminal of the power transistor through the second charging path for a predetermined time period.

8. A gate driver according to claim 4, wherein each of the first and second charging paths comprises a controllable series connected FET transistor controlled by the controller or sequencer.

9. A gate driver according to claim 5, wherein the controller or sequencer is adapted to disrupt the supply of charging current from the second voltage supply until the gate voltage reaches the first gate voltage.

10. A gate driver according to claim 1, wherein the voltage of the second voltage supply is at least one gate-to-source voltage drop of the power transistor higher than a voltage of the first voltage supply during a conducting state or ON-state of the power transistor.

11. A gate driver according to claim 1, wherein the voltage of the second voltage supply is at least 2 Volts higher than the voltage of the first voltage supply during a conducting state or ON-state of the power transistor.

12. A gate driver according to claim 1, wherein the first charging path is adapted to charge the gate terminal to the first gate voltage in less than 100 nanoseconds.

13. A gate driver according to claim 1, wherein the voltage level on the second voltage supply is at least 2.5 Volt higher than the voltage level on the first voltage supply at all times during operation of the gate driver.

14. A load driving assembly, comprising:
a plurality of gate drivers in connection with a plurality of power transistors, the plurality of power transistors being coupled in cascade with an upper leg formed between a first DC supply voltage and an output terminal and a lower leg formed between the output terminal and the second DC supply voltage, the output terminal being electrically coupled between the upper and lower legs;
each of the plurality of power transistors having a gate terminal electrically connected to a first node of a first charging path and to a first node of a second charging path of a gate driver;
each of the plurality of power transistors having a drain terminal electrically coupled to a second node of the first charging path to provide the first supply voltage for the power transistor;
a plurality of assembly input terminals coupled to respective inputs of the plurality of gate drivers to supply modulated input signals thereto;
each of the plurality of gate drivers comprising:
the first charging path electrically connectable between a first DC supply voltage and the gate terminal of the power transistor for charging the gate terminal to a first gate voltage; and
the second charging path electrically connected between a second DC supply voltage and the gate terminal of the power transistor for charging the gate terminal from the first gate voltage to a second gate voltage larger than the first gate voltage,
wherein a voltage of the second DC supply voltage is higher than a voltage of the first DC supply voltage.

15. A load driving assembly according to claim 14, further comprising:
a DC voltage source configured to set a predetermined DC voltage difference between a first node, situated between a pair of cascaded power transistors of the upper leg, and a second node, situated between a pair cascaded power transistors of the lower leg.

16. A load driving assembly according to claim 15, wherein the DC voltage sources comprises at least one device or component selected from a group consisting of a charged capacitor, a floating DC supply rail, and a battery.

17. A load driving assembly according to claim 16, wherein the DC voltage source comprises a charged capacitor with a capacitance between 100 nF and 10 μF.

18. A load driving assembly according to claim 16, wherein the predetermined DC voltage difference is substantially equal to one half of a DC voltage difference between the first and second DC supply voltages so as to enable the generation of a 3-level output signal at the output terminal.

19. A load driving assembly according to claim 14, adapted to operate at a DC voltage difference between 5 Volt and 120 Volt between the first and second DC supply voltages.

20. A load driving assembly according to claim 14, wherein the plurality of power transistors comprise at least one N-channel field effect transistor such as a NMOS or IGBT deposited on semiconductor substrate such as Silicon, Gallium Nitride or Silicon Carbide.

21. A load driving assembly according to claim 14, wherein the second voltage supplies of the plurality of gate drivers are electrically connected to a common charge pump capacitor of the second voltage supply.

22. A semiconductor substrate comprising a load driving assembly according to claim 14 coupled to an external charge pump capacitor.

23. A class D audio amplifier comprising:
a load driving assembly according to claim 14.

24. A class D audio amplifier according to claim 23, wherein the load driving assembly is connectable to a loudspeaker via an output terminal.

25. A load driving assembly according to claim 14, wherein the load driving assembly is integrated on a semiconductor substrate.

26. A load driving assembly according to claim 14, wherein the first voltage supply of each gate driver comprises a drain voltage of the power transistor.

27. A load driving assembly according to claim 14, wherein each gate driver comprises a controller or sequencer adapted to control supply of charging current to the gate terminal of the power transistor through the first charging path and control supply of charging current to the gate terminal of the power transistor through the second charging path, and optionally, the OFF-state and ON-state of the controllable discharge path.

28. A load driving assembly according to claim 27, wherein the controller or sequencer is adapted to control the supply of charging currents to the gate terminal of the power transistor through the first and second charging paths by comparing the gate voltage of the power transistor with a predetermined threshold voltage.

29. A load driving assembly according to claim 28, wherein the controller or sequencer is adapted to derive the predetermined threshold voltage from the drain voltage of the power transistor electrically coupled to the first charging path.

30. A load driving assembly according to claim 27, wherein the controller or sequencer is adapted to supply charging current to the gate terminal of the power transistor through the first charging path for a predetermined charging time period such as a time period between 5 and 100 nanoseconds to reach the first gate voltage; and subsequently supply charging current to the gate terminal of the power transistor through the second charging path for a predetermined time period.

31. A load driving assembly according to claim 27, wherein each of the first and second charging paths of each gate driver comprises a controllable series connected FET transistor controlled by the controller or sequencer.

32. A load driving assembly according to claim 28, wherein the controller or sequencer is adapted to disrupt the supply of charging current from the second voltage supply until the gate voltage reaches the predetermined threshold voltage.

33. A load driving assembly according to claim 14, wherein the voltage of the second voltage supply of each gate driver is at least one gate-to-source voltage drop of the power transistor higher than voltage of the first voltage supply during a conducting state or ON-state of the power transistor.

34. A load driving assembly according to claim 14, wherein the first charging path of each gate driver is adapted to charge the gate terminal to the first gate voltage in less than 100 nanoseconds.

35. A load driving assembly according to claim 14, wherein the voltage level of the second voltage supply is at least 2.5 Volt higher than the voltage level on the first voltage supply at all times during operation of the gate driver.

* * * * *